United States Patent
Goto

(10) Patent No.: US 9,608,561 B2
(45) Date of Patent: Mar. 28, 2017

(54) POWER GENERATION CONTROL APPARATUS, SOLAR POWER GENERATION SYSTEM, AND POWER GENERATION CONTROL METHOD

(71) Applicant: KYOCERA CORPORATION, Kyoto (JP)

(72) Inventor: Ryo Goto, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 115 days.

(21) Appl. No.: 14/408,546

(22) PCT Filed: Jun. 25, 2013

(86) PCT No.: PCT/JP2013/003955
§ 371 (c)(1),
(2) Date: Dec. 16, 2014

(87) PCT Pub. No.: WO2014/002476
PCT Pub. Date: Jan. 3, 2014

(65) Prior Publication Data
US 2015/0194925 A1    Jul. 9, 2015

(30) Foreign Application Priority Data

Jun. 25, 2012 (JP) ................. 2012-142490

(51) Int. Cl.
*G05F 1/67* (2006.01)
*H02S 40/32* (2014.01)
(Continued)

(52) U.S. Cl.
CPC ............ *H02S 40/32* (2014.12); *G01R 21/002* (2013.01); *G05F 1/67* (2013.01);
(Continued)

(58) Field of Classification Search
CPC ... G05F 1/67; H02M 7/5387; H02M 7/53871; H02M 7/53873; H02M 7/539; H02M 7/5395; Y02B 10/10
See application file for complete search history.

(56) References Cited

U.S. PATENT DOCUMENTS

| 5,869,956 A | 2/1999 | Nagao et al. |
| 9,235,226 B2 | 1/2016 | Klein et al. |

(Continued)

FOREIGN PATENT DOCUMENTS

| EP | 0653692 A2 | 5/1995 |
| EP | 2360546 A1 | 8/2011 |

(Continued)

OTHER PUBLICATIONS

Extended European Search Report dated Apr. 7, 2016 issued by the European Patent Office for Counterpart European Application No. EP 13 810 677.8.

(Continued)

*Primary Examiner* — Harry Behm
(74) *Attorney, Agent, or Firm* — Procopio Cory Hargreaves and Savitch LLP

(57) ABSTRACT

A power generation control apparatus (14) includes a solar cell controller (18) and a range determinator (20). The solar cell controller (18), while changing at least one of an operation current and an operation voltage serving as driving variables within a first range, calculates actual power generated by a solar cell (13). The solar cell controller (18) controls the solar cell (13) to generate power by using a driving variable that maximizes the generated power within the first range. The range determinator (20), based on maximum generated power and at least one of a rated PV curve or an approximation line of the rated PV curve and a rated PI curve or an approximation line of the rated PI curve, updates the first range.

14 Claims, 17 Drawing Sheets

(51) Int. Cl.
*H02J 3/38* (2006.01)
*H02S 50/10* (2014.01)
*H01L 31/02* (2006.01)
*G01R 21/00* (2006.01)
*H02M 7/44* (2006.01)

(52) U.S. Cl.
CPC ........ *H01L 31/02021* (2013.01); *H02J 3/385* (2013.01); *H02M 7/44* (2013.01); *H02S 50/10* (2014.12); *Y02E 10/58* (2013.01)

(56) References Cited

U.S. PATENT DOCUMENTS

| | | |
|---|---|---|
| 2012/0013288 A1 | 1/2012 | Kim et al. |
| 2012/0242152 A1* | 9/2012 | Escobar .................. G05F 1/67 307/77 |
| 2013/0027020 A1 | 1/2013 | Klein et al. |

FOREIGN PATENT DOCUMENTS

| | | |
|---|---|---|
| JP | H09-230952 A | 9/1997 |
| JP | 2004-295688 A | 10/2004 |
| JP | 2008-176474 A | 7/2008 |
| JP | 2012-027913 A | 2/2012 |
| WO | 2012-020103 A2 | 2/2012 |

OTHER PUBLICATIONS

Esram T et al: "Comparison of Photovoltaic Array Maximum Power Point Tracking Techniques", IEEE Transactions on Energy Conversion, IEEE Service Center, Piscataway, NJ, US, vol. 22, No. 2, Jun. 1, 2007 (Jun. 1, 2007), pp. 439-449, XP011184738, ISSN: 0885-8969, DOI: 10.1109/TEC.2006.874230.
International Search Report; PCT/JP2013/003955; Jul. 23, 2013.
Written Opinion of the International Searching Authority; PCT/JP2013/003955; Jul. 23, 2013; with concise explanation.

* cited by examiner

POWER GENERATION CONTROL APPARATUS, SOLAR POWER GENERATION SYSTEM, AND POWER GENERATION CONTROL METHOD

CROSS REFERENCE TO RELATED APPLICATION

This application claims priority to and the benefit of Japanese Patent Application No. 2012-142490 filed on Jun. 25, 2012, the entire contents of which are incorporated herein by reference.

TECHNICAL FIELD

The present invention relates to a power generation control apparatus, a solar power generation system, and a power generation control method that maximize power generation of a solar cell.

BACKGROUND ART

There has been known a solar power generation system that uses a solar cell for photoelectrical conversion of the sunlight. Although the solar cell generates DC power, load devices in general are normally driven with AC power. Therefore, the solar power generation system converts the DC power into the AC power by using an inverter.

Incidentally, based on an amount of solar radiation on the solar cell and temperature, an operation point, i.e., an operation current and/or an operation voltage for generating maximum power vary. In order to make effective use of the solar cell, accordingly, it is required that the solar cell be powered by the operation current and/or the operation voltage that maximize the power generation of the solar cell of the situation.

For determination on the operation voltage and the like that maximize the power generation, a hill climbing method that detects the power generation of the solar cell while periodically changing the operation voltage of the solar cell and tracks a maximum output point has been known as one of maximum power point tracking (MPPT: Maximum Power Point Tracking) controls (see Patent Document 1).

RELATED ART DOCUMENT

Patent Document

Patent Document 1: Japanese Patent Application Laid-Open Publication No. 2004-295688

SUMMARY OF INVENTION

Technical Problem

In the hill climbing method, the solar cell is controlled to generate power while the operation voltage is changed, and the generated power is repeatedly compared to a maximum value of the generated power obtained during the change in the operation voltage, thereby detecting the maximum output point. Therefore, when the operation voltage is changed over an entire adjustable range thereof, the detection of the maximum output point becomes time-consuming, degrading power generation efficiency.

In using the hill climbing method, on the other hand, narrowing a changing range of the operation voltage allows quick detection of the maximum output point. However, when, for example, a portion of a solar panel is shaded, a plurality of maximum values of the generated power may be generated in relation to the operation voltage of the solar cell. In such a case, narrowing the changing range of the operation voltage causes the solar cell to generate power at a single maximum value, and thus the power generation of the solar cell is not necessarily maximized.

Accordingly, an object of the present invention in view of the above circumstances is to provide the power generation control apparatus, the solar power generation system, and the power generation control method that are capable of quickly tracking the maximum output point of the solar cell.

Solution to Problem

In order to solve the above problems, a power generation control apparatus according to a first aspect of the present invention includes:

a solar cell controller for calculating actual power generated by a solar cell while changing, within a first range, at least one of an operation current of the solar cell and an operation voltage of the solar cell that serve as driving variables, and for executing first MPPT control for controlling the solar cell to generate power by using a driving variable that maximizes generated power within the first range; and a range determinator for updating the first range based on maximum generated power calculated during the change in the driving variable within the first range and at least one of a rated PV curve indicative of a relation between the generated power and the operation voltage of the solar cell or an approximation line of the rated PV curve and a rated PI curve indicative of a relation between the operation current of the solar cell and the generated power or an approximation line of the rated PI curve.

Preferably, a second aspect of the present invention is the power generation control apparatus, wherein at least one of an upper limit and a lower limit of the first range updated by the range determinator corresponds to the operation voltage for allowing maximum power generation on the rated PV curve or on the approximation line of the rated PV curve, and the other corresponds to the operation current for allowing maximum power generation on the rated PI curve or on the approximation line of the rated PI curve.

Preferably, a third aspect of the present invention is the power generation control apparatus, wherein the approximation line of the rated PV curve is determined based on the following formula:

[Formula 1]

$$V = \frac{C_1}{I_{sc}} \times P$$

provided that P represents the generated power, V represents the operation voltage, $I_{sc}$ represents a short circuit current of the solar cell, and $C_1$ represents a first invariable larger than 0 and equal to or smaller than 1.

Preferably, a fourth aspect of the present invention is the power generation control apparatus, wherein the first range is determined such that the lower limit of the operation voltage is expressed by the following formula:

[Formula 2]

$$\frac{C_1}{I_{sc}} \times P_{nmax}$$

provided that $P_{nmax}$ represents the maximum generated power.

Preferably, a fifth aspect of the present invention is the power generation control apparatus, wherein
the approximation line of the rated PI curve is determined based on the following formula:

[Formula 3]

$$I = \frac{C_2}{V_{oc}} \times P$$

provided that P represents the generated power, I represents the operation current, $V_{oc}$ represents an open circuit voltage of the solar cell, and $C_2$ represents a second invariable larger than 0 and equal to or smaller than 1.

Preferably, a sixth aspect of the present invention is the power generation control apparatus, wherein
the first range is determined such that the lower limit of the operation current is expressed by the following formula:

[Formula 4]

$$\frac{C_2}{V_{oc}} \times P_{nmax}$$

provided that $P_{nmax}$ represents the maximum generated power.

Preferably, a seventh aspect of the present invention is the power generation control apparatus, wherein
the approximation line of the rated PI curve is determined based on the following formula:

[Formula 5]

$$P = -\frac{V^2}{R_{sh}} + V \times I_{sc}$$

provided that P represents the generated power, V represents the operation voltage, $R_{sh}$ represents parallel resistance of the solar cell, and $I_{sc}$ represents the short circuit current of the solar cell.

Preferably, an eighth aspect of the present invention is the power generation control apparatus, wherein
the first range is determined such that the lower limit of the operation voltage is expressed by the following formula:

[Formula 6]

$$\frac{I_{sc} \times R_{sh}}{2} - \sqrt{\left(\frac{I_{sc} \times R_{sh}}{2}\right)^2 - P_{nmax} \times R_{sh}}$$

provided that $P_{nmax}$ represents the maximum generated power.

Preferably, a ninth aspect of the present invention is the power generation control apparatus, wherein
the approximation line of the rated PI curve is determined based on the following formula:

[Formula 7]

$$P = -\frac{I^2}{R_s} + V_{oc} \times I$$

provided that P represents the generated power, I represents the operation current, $R_s$ represents series resistance of the solar cell, and $V_{oc}$ represents the open circuit voltage of the solar cell.

Preferably, a tenth aspect of the present invention is the power generation control apparatus, wherein
the first range is determined such that the lower limit of the operation voltage is expressed by the following formula:

[Formula 8]

$$\frac{V_{oc}}{2 \times R_s} - \sqrt{\left(\frac{V_{oc}}{2 \times R_s}\right)^2 - \frac{P_{nmax}}{R_s}}$$

provided that $P_{nmax}$ represents the maximum generated power.

Preferably, an eleventh aspect of the present invention is the power generation control apparatus, wherein
the first MPPT control includes upward direction MPPT control for changing the driving variable so as to increase the operation voltage and downward direction MPPT control for changing the driving variable so as to reduce the operation voltage, and
the power generation control apparatus separately includes an execution period of the upward direction MPPT control and an execution period of the downward direction MPPT control.

Preferably, a twelfth aspect of the present invention is the power generation control apparatus, wherein
in using the operation voltage as the driving variable,
the execution period of the downward direction MPPT control is set to be longer as a ratio of a changing range of the voltage corresponding to the first range of the open circuit voltage of the solar cell is smaller, and
the execution period of the upward direction MPPT control is set to be longer as a ratio of a changing range of the current corresponding to the first range of the short circuit current of the solar cell is smaller.

Preferably, a thirteenth aspect of the present invention is the power generation control apparatus including:
a method selector for controlling the solar cell controller to execute the first MPPT control in a first period and, in a second period shorter than the first period, second MPPT control for changing the generated power in an increasing direction until the actual power generated by the solar cell reaches a maximum value.

In order to solve the above problem, a solar power generation system according to a fourteenth aspect of the present invention includes:
a solar cell;
a solar cell controller for calculating actual power generated by the solar cell while changing, within a first range, at least one of an operation current of the solar cell and an operation voltage of the solar cell that serve as driving variables and for executing first MPPT control for controlling the solar cell to generate power by using a driving variable that maximizes generated power within the first range; and
a range determinator for updating the first range based on maximum generated power calculated during the change in the driving variable within the first range and at least one of a rated PV curve indicative of a relation between the operation voltage of the solar cell and the generated power or an approximation line of the rated PV curve and a rated PI curve indicative of a relation between the operation current of the solar cell and the generated power or an approximation line of the rated PI curve.

It is appreciated that, although the apparatus is employed as the solution of the present invention as described above, a method, a program, and a storage medium storing the program that substantially correspond to the above apparatus may also substantialize the present invention and thus are also included in the scope of the present invention.

For example, as a method substantializing the present invention, a power generation control method according to a fifteenth aspect of the present invention is a power generation control method for maximizing power generation of a solar cell while changing at least one of an operation current of the solar cell and an operation voltage of the solar cell that serve as driving variables, the power generation control method includes:

a changing step of changing the driving variable by a predetermined amount;

a comparing step of comparing present generated power of the solar cell controlled to generate power by using the driving variable changed at the changing step to maximum generated power;

an updating step of, when the present generated power is greater than the maximum generated power, updating the maximum generated power with the present generated power;

a setting step of setting a changing range of the driving variable based on the maximum generated power and at least one of a rated PV curve indicative of a relation between the operation voltage of the solar cell and generated power or an approximation line of the rated PV curve and a rated PI curve indicative of a relation between an operation current of the solar cell and the generated power or an approximation line of the rated PI curve;

a repeating step of repeating the changing step, the comparing step, the updating step, and the setting step until the driving variable reaches an upper limit or a lower limit determined based on the changing range; and a power generation step of controlling the solar cell to generate power by using the driving variable used for generating the maximum power when the driving variable reaches the upper limit or the lower limit.

Effect of the Invention

The power generation control apparatus, the solar power generation system, and the power generation control method that are as described above are capable of quick tracking of a maximum output point of the solar cell.

DESCRIPTION OF EMBODIMENTS

Hereinafter, embodiments of the present invention will be described with reference to the accompanying drawings.

Figure 1:
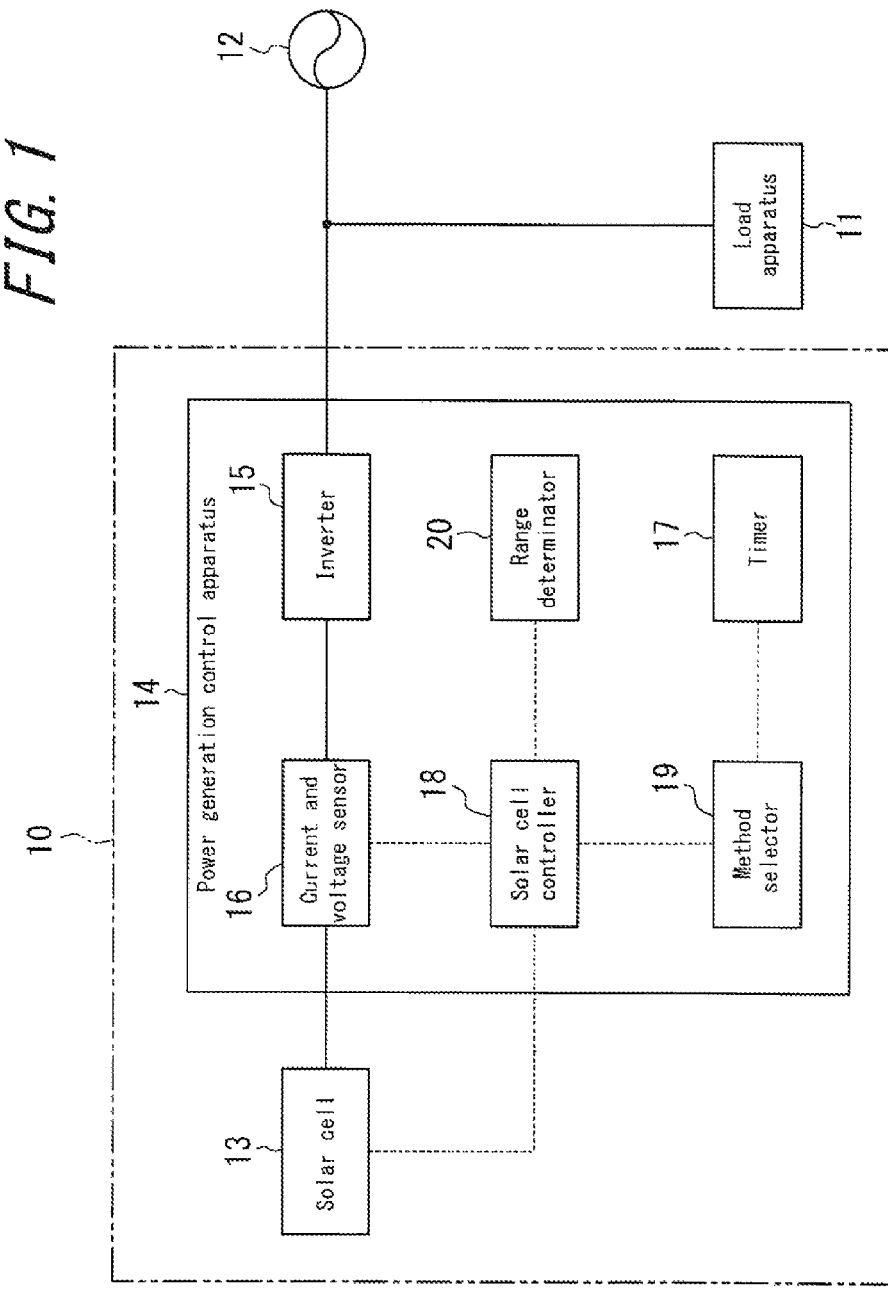
FIG. 1 is a functional block diagram illustrating a schematic configuration of a solar power generation system including a power generation control apparatus according to a first embodiment of the present invention.

First, a solar power generation system including a power generation control apparatus according to a first embodiment of the present invention will be described. FIG. 1 is a functional block diagram illustrating a schematic configuration of the solar power generation system including the power generation control apparatus according to the present embodiment. In FIG. 1, solid lines connecting each functional block represent a power flow. In FIG. 1, also, broken lines connecting each functional block represent a flow of a control signal or transmitted information.

As illustrated in FIG. 1, a solar power generation system 10 is connected to a load apparatus 11 and a commercial system 12. The solar power generation system 10 supplies AC power to the load apparatus 11. When the AC power supplied from the solar power generation system 10 is insufficient for the demand of the load apparatus 11, the commercial system 12 supplies the shortage to the load apparatus 11. When the AC power supplied from the solar power generation system 10 is excessive over the demand of the load apparatus 11, the excessive power is flown in reverse to the commercial system 12 for electric power selling.

The solar power generation system 10 includes a solar cell 13 and a power generation control apparatus 14.

The solar cell 13 generates DC power by photoelectrically converting light incident on the solar panel.

The power generation control apparatus 14 may convert a DC current output from the solar cell 13 into an AC current and supply the AC current to the load apparatus 11 and the commercial system 12. Also, the power generation control apparatus 14 carries out MPPT control to the solar cell 13 so as to maximize the power generated by the solar cell 13.

The power generation control apparatus 14 includes an inverter 15, a current and voltage sensor 16, a timer 17, a solar cell controller 18, a method selector 19, and a range determinator 20.

The inverter 15 converts the DC power generated by the solar cell 13 into the AC power. The current and voltage sensor 16 detects an operation current and an operation voltage of the solar cell 13. The timer 17 counts the present time.

The solar cell controller 18 controls the solar cell 13 to generate power by using a particular driving variable. The driving variable is at least one of the operation voltage and the operation current of the solar cell 13. According to the present embodiment, the method selector 19 determines one of the operation voltage and the operation current as the driving variable to be used to drive the solar cell 13. Varying the driving variable changes the power generated by the solar cell 13.

The solar cell controller 18, also, executes first MPPT control or second MPPT control so as to maximize the power generated by the solar cell 13.

In first MPPT control, the solar cell controller 18 changes the driving variable in either one of a downward direction or an upward direction until the driving variable reaches a lower limit or an upper limit of a first range that is set or updated by the range determinator 20. The solar cell controller 18, while changing the driving variable, calculates actual generated power of the solar cell 13. The solar cell controller 18, when the driving variable reaches the lower limit or the upper limit of the first range, controls the solar cell 13 to generate power by using a driving variable that maximizes generated power during the change of the driving variable within the first range.

In second MPPT control, the solar cell controller 18 changes the driving variable in a direction that increases the power generated by the solar cell 13. The solar cell controller 18, while changing the driving variable, calculates the actual generated power of the solar cell 13. The solar cell controller 18, when the actual generated power of the solar cell 13 turns to decrease, stops changing the driving variable and controls the solar cell 13 to generate power by using a driving variable immediately before the turning to decrease.

The method selector 19 controls the solar cell controller 18 to execute either one of the first MPPT control and the second MPPT control. The first MPPT control includes downward direction MPPT control and upward direction MPPT control. The method selector 19 controls the solar cell controller 18 to execute the downward direction MPPT control in a downward direction period, the upward direction MPPT control in an upward direction period, and the second MPPT control in a second period.

The method selector 19, as described in detail later, determines the upward direction period and the downward direction period based on variables obtained in the upward direction MPPT control and the downward direction MPPT control, which are previously executed, respectively. Note that lower limits of the upward direction period and the downward direction period are determined to be longer than the second period that is preliminarily determined as a fixed value.

The range determinator 20, at the start of the first MPPT control, determines the first range for changing the driving variable. Also, the range determinator 20 updates the first range during execution of the first MPPT control.

Next, the first MPPT control, i.e., the downward direction MPPT control and the upward direction MPPT control will be described in detail. In downward direction MPPT control, the operation voltage serving as the driving variable is reduced. In upward direction MPPT control, the operation current serving as the driving variable is reduced, thereby increasing the operation voltage.

After starting the downward direction MPPT control, the solar cell controller 18 calculates present generated power of the solar cell 13. The solar cell controller 18 stores the present generated power and a corresponding operation voltage as maximum generated power and a maximum operation voltage, respectively.

Figure 2:
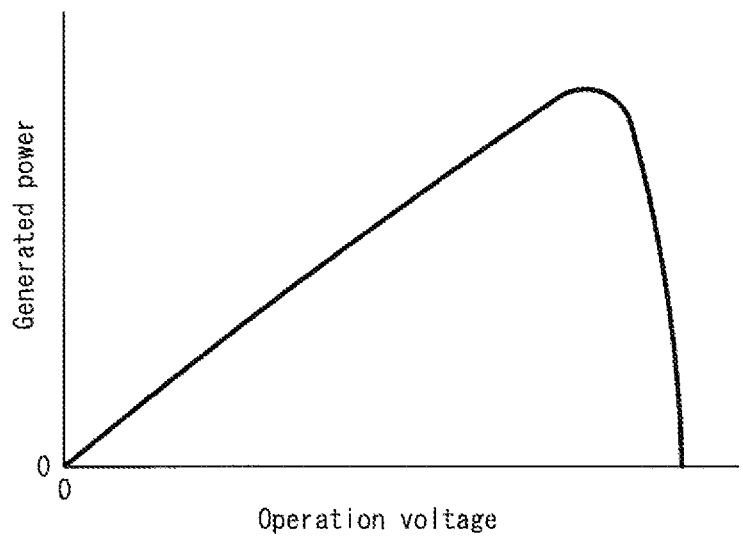
FIG. 2 is a graph illustrating a rated PV curve of a solar cell.

The range determinator 20, based on the maximum generated power and a rated PV curve, determines the lower limit of the first range for changing the operation voltage. The rated PV curve, as illustrated in FIG. 2, is a curve indicative of a relation between each rated operation voltage and the generated power. That is, the rated PV curve is a curve indicating a relation between each operation voltage and the maximum generated power. The range determinator 20 determines, as the lower limit of the first range, a smaller operation voltage between two operation voltages corresponding to the maximum generated power on the rated PV curve.

After the determination on the lower limit of the first range, the method selector 19 sets a unit change amount of the operation voltage to a first changing voltage $\Delta V_1$, which is a predetermined value. The solar cell controller 18 controls the solar cell 13 to generate power such that the operation voltage meets a value obtained by reducing the first changing voltage $\Delta V_1$ from a present operation voltage. The solar cell controller 18, based on an actual operation voltage and the operation current of the solar cell 13 after the change in the operation voltage, calculates the actual generation power of the solar cell 13. The solar cell controller 18 compares the actual generated power to the maximum generated power being stored.

When the actual generated power is greater than the maximum generated power, the solar cell controller 18 updates the maximum generated power being stored with the actual generated power and also updates the corresponding maximum operation voltage. When the maximum generated power is updated, the range determinator 20, based on thus updated maximum generated power and the rated PV curve, updates the lower limit of the first range of the operation voltage. When the actual generated power is equal to or smaller than the maximum generated power, neither the solar cell controller 18 nor the range determinator 20 updates the maximum generated power and the lower limit of the first range of the operation voltage, respectively.

After the comparison of the actual generated power to the maximum generated power, the solar cell controller 18 once again controls the solar cell 13 to generate power such that the operation voltage meets the value obtained by reducing the first changing voltage $\Delta V_1$ from the present operation voltage. In a manner similar to the control described above, the solar cell controller 18 calculates the actual generated power of the solar cell 13. Further, the solar cell controller 18 compares the actual generated power to the maximum generated power being stored.

The solar cell controller 18 thereafter repeats changing the operation voltage until the operation voltage reaches the lower limit of the first range. The solar cell controller 18, when the operation voltage reaches the lower limit of the first range, stops changing the operation voltage. The solar cell controller 18 detects the maximum operation voltage stored at the end of the change in the operation voltage as the operation voltage for maximizing the generated power of the solar cell 13 of the present condition. The solar cell controller 18 controls the solar cell 13 to generate power by using the maximum operation voltage.

In downward direction MPPT control, further, the method selector 19 calculates the downward direction period before execution of next downward direction MPPT control. A downward direction period $\Delta T_{vd}$ is calculated by substituting an open circuit voltage $V_{oc}$ of the solar cell 13, a present operation voltage $V_{pv}$, and a lower limit $V_{nmin}$ of the first range into the following formula (1).

[Formula 9]

$$\Delta T_{vd} = T_{base} \times \exp\left(A \times \frac{V_{pv} - V_{nmin}}{V_{oc}}\right) \quad (1)$$

In the formula (1), $T_{base}$ represents a predetermined base period that is set to be longer than the second period. Also, A is an invariable. After the execution of the downward direction MPPT control, when the calculated downward direction period calculated has elapsed, the method selector 19 controls the solar cell controller 18 to execute the downward direction MPPT control.

After the start of the upward direction MPPT control, in a manner similar to the downward direction MPPT control, the solar cell controller 18 calculates the present generated power of the solar cell 13. The solar cell controller 18 stores the present generated power and an operation current corresponding thereto as the maximum generated power and the maximum operation current, respectively.

Figure 3:
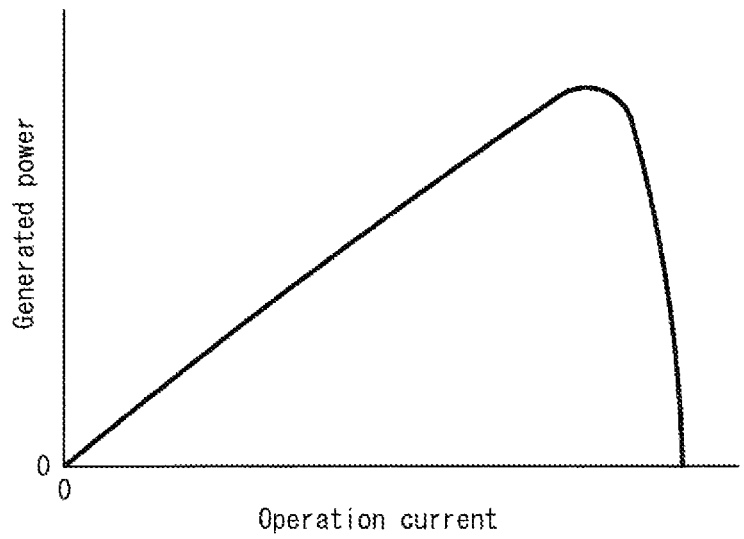
FIG. 3 is a graph illustrating a rated PI curve of the solar cell.
Figure 4:
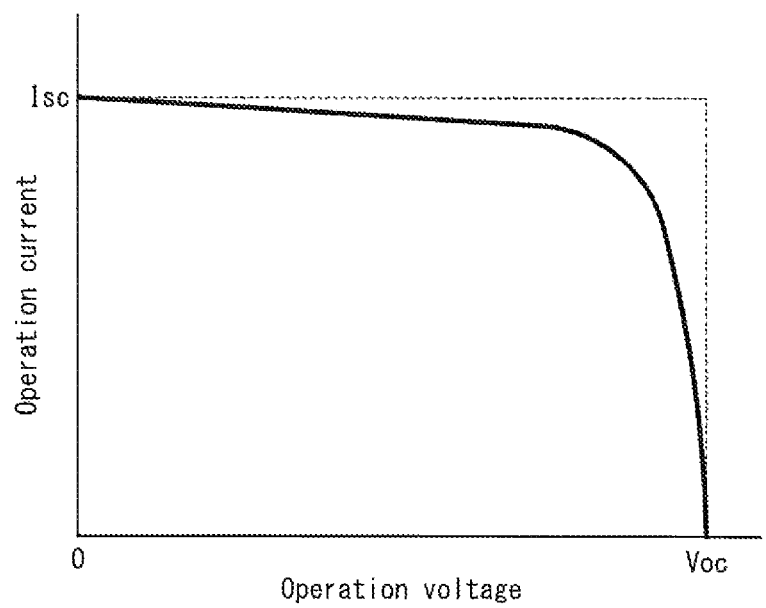
FIG. 4 is a graph illustrating a rated VI curve of the solar cell.

The range determinator 20, based on the maximum generated power and a rated PI curve, determines the lower limit of the first range for changing the operation current. The rated PI curve, as illustrated in FIG. 3, is a curve indicative of a relation between each rated operation current and the generated power. Note that, by using a rated IV curve illustrated in FIG. 4, the rated PV curve illustrated in FIG. 2 may be converted into the rated PI curve. In a manner similar to the downward direction MPPT control, the range determinator 20 determines, as the lower limit of the first range, a smaller operation current between two operation currents corresponding to the maximum generated power on the rated PI curve.

After the determination on the lower limit of the first range, the method selector 19 sets the unit change amount of the operation current during searching change to a first changing current $\Delta I_1$, which is a predetermined value. The solar cell controller 18 controls the solar cell 13 to generate power such that the operation current meets a value obtained by reducing the first changing current $\Delta I_1$ from a present operation current. Note that, as illustrated by the rated IV curve indicative of the relation between the operation voltage and the operation current of the solar cell 13 (see FIG. 4), the operation voltage increases in inverse proportion to the operation current. In upward direction MPPT control, accordingly, decreasing the operation current serving as the driving variable increases the operation voltage. Note that the lower limit of the first range of the operation current is equivalent to the upper limit of the range for changing the operation voltage.

The solar cell controller 18, based on the actual operation voltage and an actual operation current of the solar cell 13 after the change in the operation current, calculates the actual generated power of the solar cell 13. The solar cell controller 18 compares the actual generated power to the maximum generated power.

When the actual generated power is greater than the maximum generated power, the solar cell controller 18 updates the maximum generated power with the actual generated power and also updates the maximum operation current. When the maximum generated power is updated, the range determinator 20, based on the maximum generated power being updated and the rated PI curve, updates the lower limit of the first range of the operation current. When the actual generated power is equal to or smaller than the maximum generated power, neither the solar cell controller 18 nor the range determinator 20 updates the maximum generated power and the lower limit of a changing range of the operation current, respectively.

After the comparison of the actual generated power to the maximum generated power, the solar cell controller 18 once again controls the solar cell 13 to generate power such that the operation current meets the value obtained by reducing the first changing current $\Delta I_1$ from the present operation current. In a manner similar to the control described above, the solar cell controller 18 calculates the actual generated power of the solar cell 13. Further, the solar cell controller 18 compares the actual generated power to the maximum generated power being stored.

The solar cell controller 18 thereafter repeats changing the operation current until the operation current reaches the lower limit of the first range. The solar cell controller 18, when the operation current reaches the lower limit of the first range, stops changing the operation current. The solar cell controller 18 detects the maximum operation current stored at the end of the change in the operation current as the operation current for maximizing the generated power of the solar cell 13 of the present condition. The solar cell controller 18 controls the solar cell 13 to generate power by using the maximum operation current thus detected.

In upward direction MPPT control, further, the method selector 19 calculates the upward direction period before execution of next upward direction MPPT control. An upward direction period $\Delta T_{vu}$ is calculated by substituting a short circuit current $I_{sc}$ of the solar cell 13, a present operation current $I_{pv}$, and a lower limit $I_{nmin}$ of the first range into the following formula (2).

[Formula 10]

$$\Delta T_{vu} = T_{base} \times \exp\left(A \times \frac{I_{pv} - I_{nmin}}{I_{oc}}\right) \quad (2)$$

After the execution of the upward direction MPPT control, when a calculated upward direction period has elapsed, the method selector 19 controls the solar cell controller 18 to execute the upward direction MPPT control.

Next, the second MPPT control will be described in detail. In second MPPT control, first, the method selector 19 determines the operation voltage as the driving variable. Also, the method selector 19 sets the unit change amount of the operation voltage to a second changing voltage $\Delta V_2$, which is a predetermined value. The second changing voltage $\Delta V_2$ is smaller than the first changing voltage $\Delta V_1$ of the downward direction.

The solar cell controller 18 increases or reduces the present operation voltage by the second changing voltage $\Delta V_2$ and compares the power generated by the solar cell 13 before and after such a change. When the generated power after the change is larger, the solar cell controller 18 determines a present changing direction as a changing direction of the second MPPT control. When the generated power after the change is smaller, the solar cell controller 18 determines an inverse direction of the present changing direction as the changing direction of the second MPPT control.

The solar cell controller 18, while changing the operation voltage, compares the actual generated power of the solar cell 13 before and after the change in the second changing voltage $\Delta V_2$. The solar cell controller 18, after the change of the operation voltage, changes the operation voltage until the generated power decreases. When the generated power after the change decreases, the solar cell controller 18 determines the operation voltage before the change as the operation voltage for maximizing the generated power. The solar cell controller 18 controls the solar cell 13 to generate power by using the operation voltage thus determined.

Figure 5:
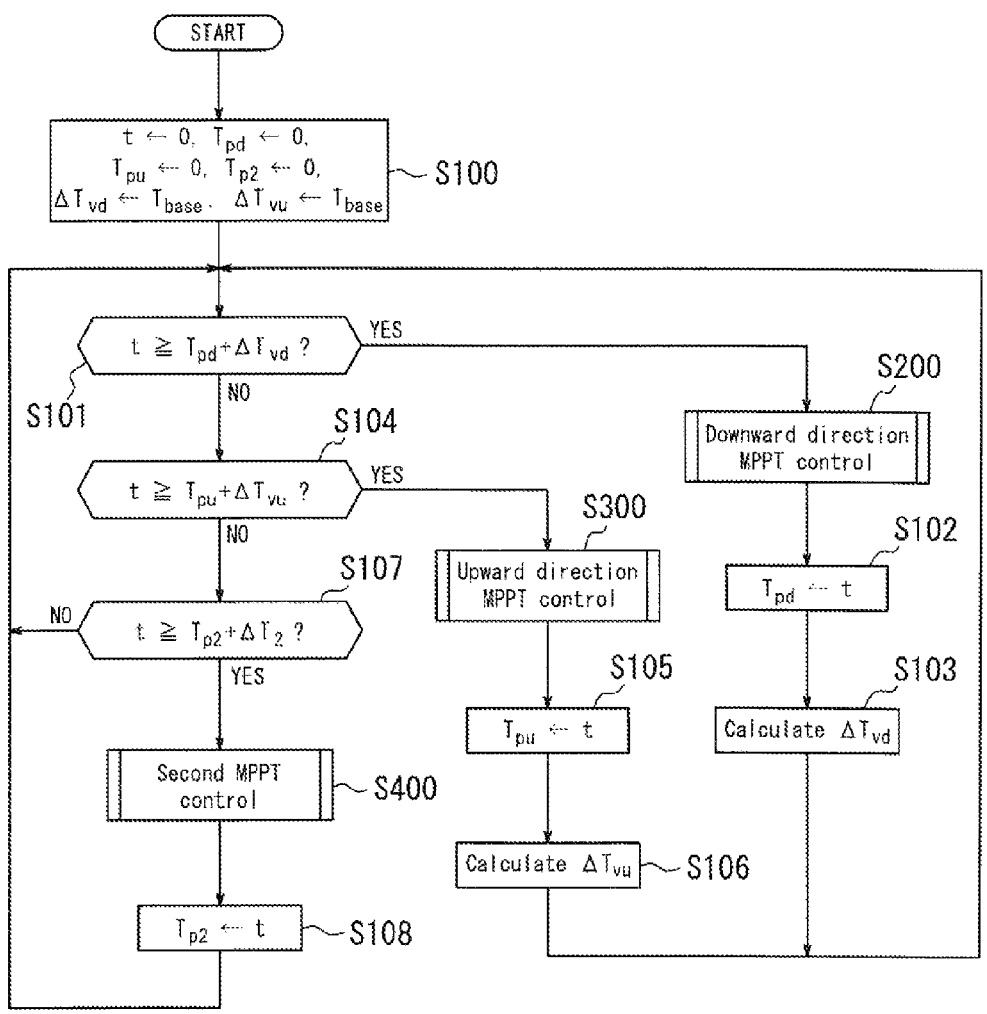
FIG. 5 is a flowchart illustrating a timing management operation executed by a method selector.

Next, a timing management operation for executing the downward direction MPPT control, the upward direction MPPT control, and the second MPPT control, which are executed by the solar cell controller 18 under control of the method selector 19, will be described with reference to a flowchart in FIG. 5. The timing management operation starts when the power generation control apparatus 14 starts converting the DC current generated by the solar cell 13 into the AC current.

At step S100, the method selector 19 resets timing management time t, previous downward direction MPPT control execution time $T_{pd}$, previous upward direction MPPT control execution time $T_{pu}$, and previous second MPPT control execution time $T_{p2}$ to zero. Also, the method selector 19 resets the downward direction period $\Delta T_{vd}$ and the upward direction period $\Delta T_{vu}$ to the base period $T_{base}$. Note that the timing management time t, after being reset to 0, changes based on the present time counted by the timer 17 and thus indicates an elapsed time after the resetting. After the resetting, the process proceeds to step S101.

At step S101, the method selector 19 determines whether the timing management time t has passed the downward direction period $\Delta T_{vd}$ from the previous downward direction MPPT control execution time $T_{pd}$. When the timing management time t has passed the downward direction period $\Delta T_{vd}$, the process proceeds to step S200. When the timing management time t has not passed the downward direction period $\Delta T_{vd}$, the process proceeds to step S104.

At step S200, the method selector 19 controls the solar cell controller 18 to execute the downward direction MPPT control. After the end of the downward direction MPPT control, the process proceeds to step S102.

At step S102, the method selector 19 updates the downward direction MPPT control execution time $T_{pd}$ with the timing management time t. After the updating, the process proceeds to step S103.

At step S103, the method selector 19, based on the present operation voltage $V_{pv}$ of the downward direction MPPT control and the lower limit $V_{nmin}$ of the first range for changing the operation voltage, calculates the downward direction period $\Delta T_{vd}$. After the calculation of the downward direction period $\Delta T_{vd}$, the process returns to step S101.

At step S104, the method selector 19 determines whether the timing management time t has passed the upward direction period $\Delta T_{vu}$ from the previous upward direction MPPT control execution time $T_{pu}$. When the timing management time t has passed the upward direction period $\Delta T_{vu}$, the process proceeds to step S300. When the timing management time t has not passed the upward direction period $\Delta T_{vu}$, the process proceeds to step S107.

At step S300, the method selector 19 controls the solar cell controller 18 to execute the upward direction MPPT control. After the upward direction MPPT control, the process proceeds to step S105.

At step S105, the method selector 19 updates the upward direction MPPT control execution time $T_{pu}$ with the timing management time t. After the updating, the process proceeds to step S106.

At step S106, the method selector 19, based on the present operation current $I_{pv}$ of the upward direction MPPT control and the lower limit $I_{nmin}$ of the first range for changing the operation current, calculates the upward direction period $\Delta T_{vu}$. After the calculation of the upward direction period $\Delta T_{vu}$, the process returns to step S101.

At step S107, the method selector 19 determines whether the timing management time t has passed the second period $\Delta T_2$ from the previous second MPPT control execution time $T_{p2}$. When the timing management time t has passed the second period $\Delta T_2$, the process proceeds to step S400. When the timing management time t has not passed the second period $\Delta T_2$, the process returns to step S101.

At step S400, the method selector 19 controls the solar cell controller 18 to execute the second MPPT control. After the second MPPT control, the process proceeds to step S108.

At step S108, the method selector 19 updates the second MPPT control execution time $T_{p2}$ with the timing management time t. After the updating, the process returns to step S101.

Figure 6:
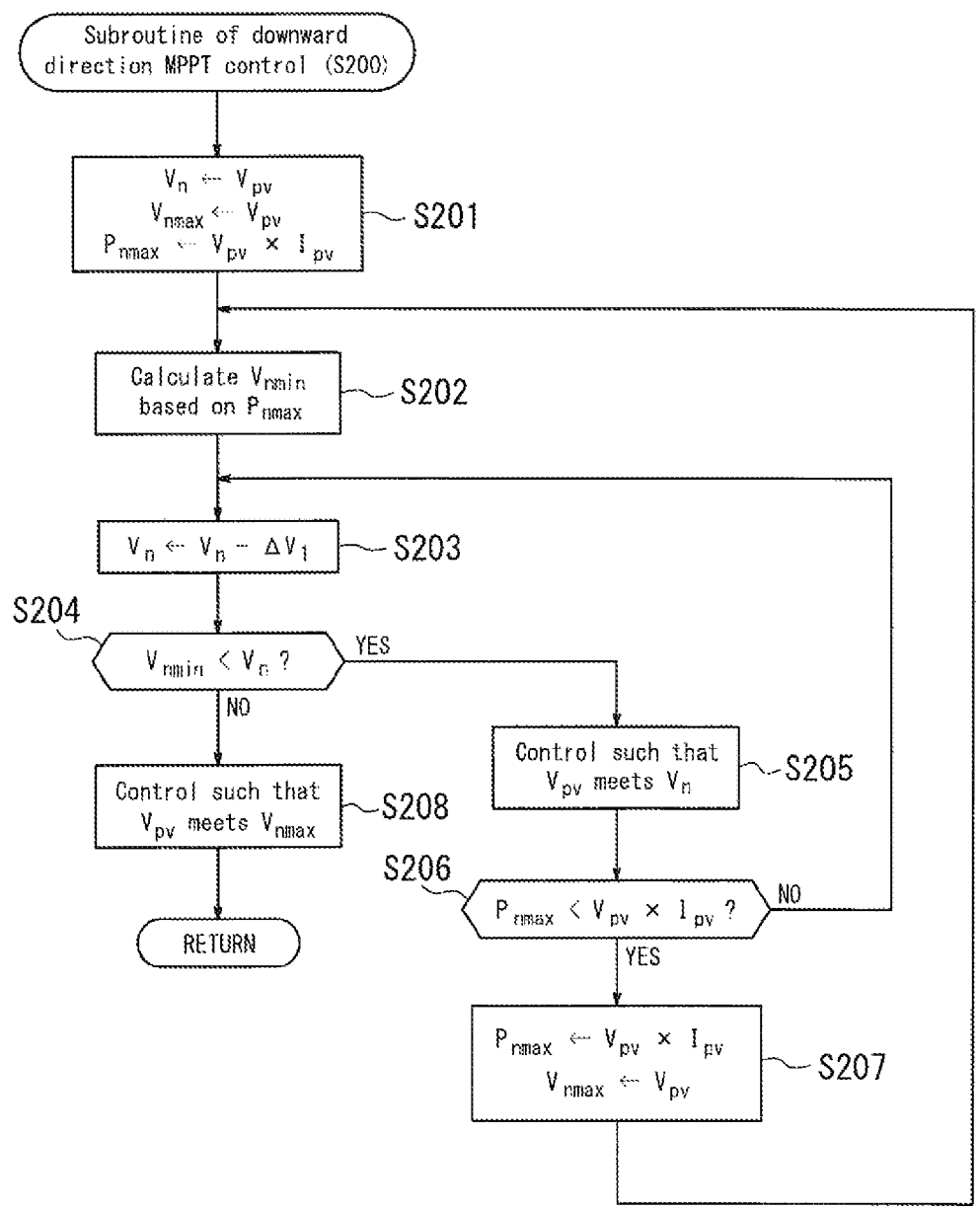
FIG. 6 is a flowchart illustrating a subroutine of downward direction MPPT control.

Next, a subroutine of the downward direction MPPT control executed at step S200 will be described with reference to a flowchart in FIG. 6.

When the subroutine of the downward direction MPPT control starts, the solar cell controller 18, at step S201, resets a command voltage $V_n$ serving as a target value of the operation voltage to the present operation voltage $V_{pv}$. Also, the solar cell controller 18 resets a maximum operation voltage $V_{nmax}$ to the present operation voltage $V_{pv}$. Further, the solar cell controller 18 resets maximum generated power $P_{nmax}$ to the product of the present operation voltage $V_{pv}$ and the present operation current $I_{pv}$. After the resetting, the process proceeds to step S202.

At step S202, the solar cell controller 18, based on the maximum generated power $P_{nmax}$ and the rated PV curve, calculates the lower limit $V_{nmin}$ of the first range of the operation voltage. After the calculation of the lower limit $V_{nmin}$, the process proceeds to step S203.

At step S203, the solar cell controller 18 updates the command voltage $V_n$ with a voltage obtained by subtracting the first changing voltage $\Delta V_1$ from the present command voltage $V_n$. After the updating of the command voltage $V_n$, the process proceeds to step S204.

At step S204, the solar cell controller 18 determines whether the command voltage $V_n$ is larger than the lower limit $V_{nmin}$ of the first range. When the command voltage $V_n$ is larger than the lower limit $V_{nmin}$, the process proceeds to step S205. When the command voltage $V_n$ is equal to or smaller than the lower limit $V_{nmin}$, the process proceeds to step S208.

At step S205, the solar cell controller 18 controls the solar cell 13 such that the present operation voltage $V_{pv}$ meets the command voltage $V_n$. After the control of the solar cell 13, the process proceeds to step S206.

At step S206, the solar cell controller 18 determines whether the product of the present operation voltage $V_{pv}$ and the present operation current $I_{pv}$ is larger than the maximum generated power $P_{nmax}$. When the product is equal to or smaller than the maximum generated power $P_{nmax}$, the process returns to step S203. When the product is larger than the maximum generated power $P_{nmax}$, the process proceeds to step S207.

At step S207, the solar cell controller 18 updates the maximum generated power $P_{nmax}$ with the product of the present operation voltage $V_{pv}$ and the present operation current $I_{pv}$. Also, the solar cell controller 18 updates the maximum operation voltage $V_{nmax}$ with the present operation voltage $V_{pv}$. After the updating, the process returns to step S202.

At step S204, as described above, when the command voltage $V_n$ is equal to or smaller than the lower limit $V_{nmin}$, the process proceeds to step S208. At step S208, the solar cell controller 18 controls the solar cell 13 such that the present operation voltage $V_{pv}$ meets the maximum operation voltage $V_{nmax}$. After the control of the solar cell 13, the subroutine of the downward direction MPPT control is ended, and the process returns to step S102.

Figure 7:
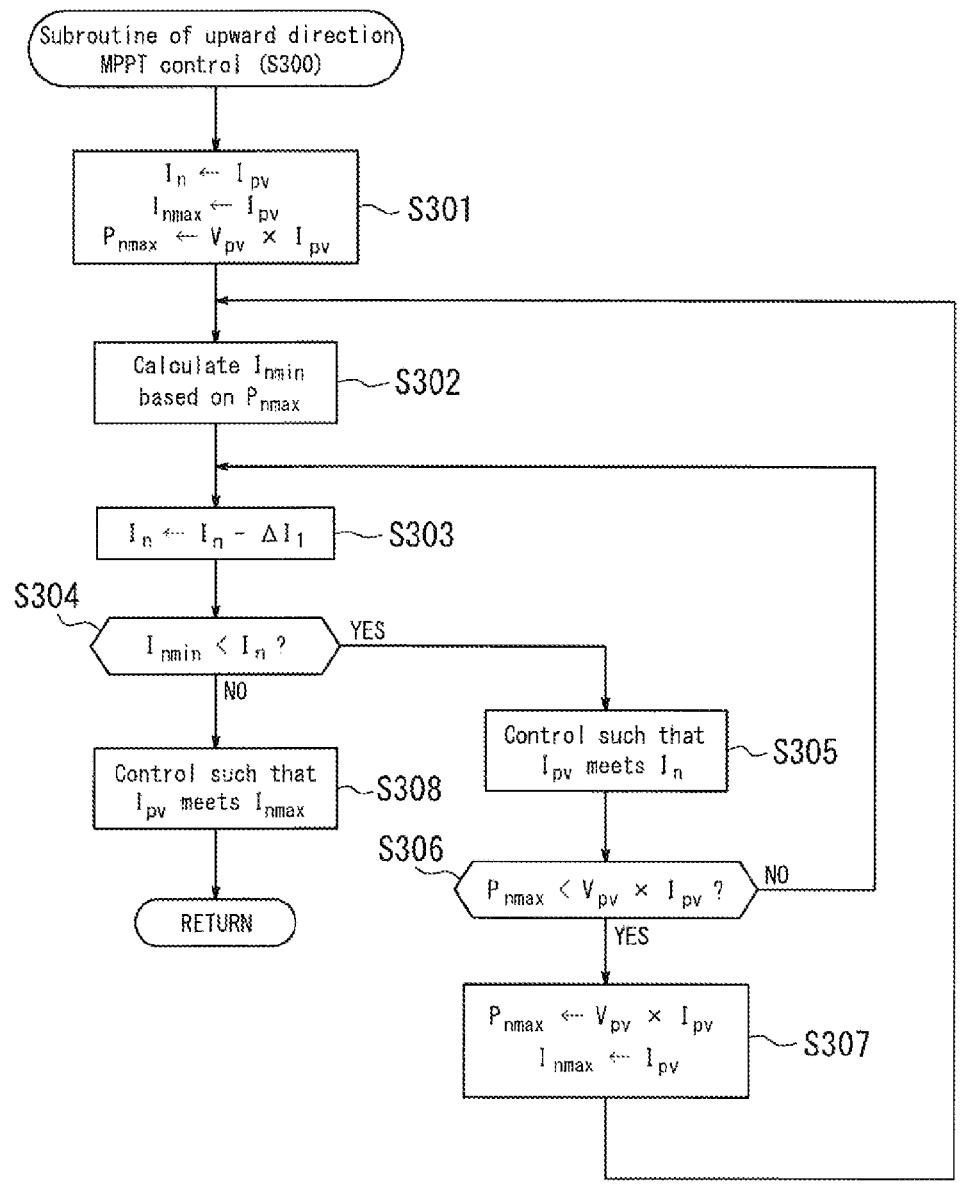
FIG. 7 is a flowchart illustrating a subroutine of upward direction MPPT control.

Next, a subroutine of the upward direction MPPT control executed at step S300 will be described with reference to a flowchart in FIG. 7.

When the subroutine of the upward direction MPPT control starts, the solar cell controller 18, at step S301, resets a command current $I_n$ serving as a target value of the operation current to the present operation current $I_{pv}$. Also, the solar cell controller 18 resets a maximum operation current $I_{nmax}$ to the present operation current $I_{pv}$. Further, the solar cell controller 18 resets the maximum generated power $P_{nmax}$ to the product of the present operation voltage $V_{pv}$ and the present operation current $I_{pv}$. After the resetting, the process proceeds to step S302.

At step S302, the solar cell controller 18, based on the maximum generated power $P_{nmax}$ and the rated PI curve, calculates the lower limit $I_{nmin}$ of the first range of the operation current. After the calculation of the lower limit $I_{nmin}$, the process proceeds to step S303.

At step S303, the solar cell controller 18 updates the command current $I_n$ with a current obtained by subtracting a first changing current $\Delta I_1$ from the command current $I_n$ of the present. After the updating of the command current $I_n$, the process proceeds to step S304.

At step S304, the solar cell controller 18 determines whether the command current $I_n$ is larger than the lower limit $I_{nmin}$ of the changing range. When the command current $I_n$ is larger than the lower limit $I_{nmin}$, the process proceeds to step S305. When the command current $I_n$ is equal to or smaller than the lower limit $I_{nmin}$, the process proceeds to step S308.

At step S305, the solar cell controller 18 controls the solar cell 13 such that the present operation current $I_{pv}$ meets the command current $I_n$. After the control of the solar cell 13, the process proceeds to step S306.

At step S306, the solar cell controller 18 determines whether the product of the present operation voltage $V_{pv}$ and the present operation current $I_{pv}$ is larger than the maximum generated power $P_{nmax}$. When the product is equal to or smaller than the maximum generated power $P_{nmax}$, the process returns to step S303. When the product is larger than the maximum generated power $P_{nmax}$, the process proceeds to step S307.

At step S307, the solar cell controller 18 updates the maximum generated power $P_{nmax}$ with the product of the present operation voltage $V_{pv}$ and the present operation current $I_{pv}$. Also, the solar cell controller 18 updates the maximum operation current $I_{nmax}$ with the present operation current $I_{pv}$. After the updating, the process returns to step S302.

At step S304, as described above, when the command current $I_n$ is equal to or smaller than the lower limit $I_{nmin}$, the process proceeds to step S308. At step S308, the solar cell controller 18 controls the solar cell 13 such that the present operation current $I_{pv}$ meets the maximum operation current $I_{nmax}$. After the control of the solar cell 13, the subroutine of the upward direction MPPT control is ended, and the process returns to step S105.

Figure 8:
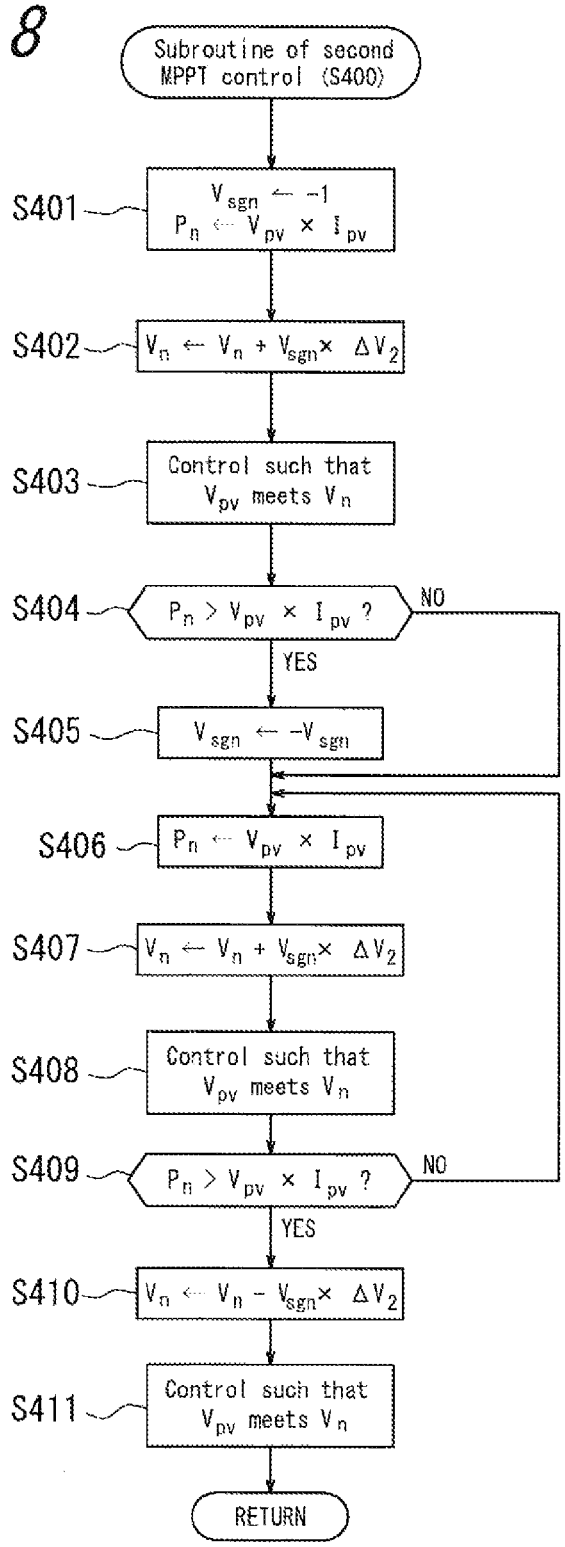
FIG. 8 is a flowchart illustrating a subroutine of second MPPT control.

Next, a subroutine of the second MPPT control executed at step S400 will be described with reference to a flowchart in FIG. 8.

When the subroutine of the second MPPT control starts, the solar cell controller 18, at step S401, resets a direction coefficient $V_{sgn}$ for determining the changing direction of the operation voltage to −1. Also, the solar cell controller 18 resets a previous generated power $P_n$ to the product of the present operation voltage $V_{pv}$ and the present operation current $I_{pv}$. After the resetting, the process proceeds to step S402.

At step S402, the solar cell controller 18 updates the command voltage $V_n$ with a voltage obtained by changing the second changing voltage $\Delta V_2$ from the present command voltage $V_n$ in a direction corresponding to a sign of the direction coefficient $V_{sng}$. After the updating of the command voltage $V_n$, the process proceeds to step S403.

At step S403, the solar cell controller 18 controls the solar cell 13 such that the present operation voltage $V_{pv}$ meets the command voltage $V_n$. After the control of the solar cell 13, the process proceeds to step S404.

At step S404, the solar cell controller 18 determines whether the product of the present operation voltage $V_{pv}$ and the present operation current $I_{pv}$ is smaller than the previous generated power $P_n$. When the product is smaller than the previous generated power $P_n$, the process proceeds to step S405. When the product is equal to or larger than the previous generated power $P_n$, the process proceeds to step S406, skipping the step S405.

At step S405, the solar cell controller 18 inverts the sign of the direction coefficient $V_{sgn}$. After the inversion, the process proceeds to step S406.

At step S406, the solar cell controller 18 updates the previous generated power $P_n$ with the product of the present operation voltage $V_{pv}$ and the present operation current $I_{pv}$. After the updating, the process proceeds to step S407.

At step S407 and subsequent step S408, similarly to step S402 and step S403, respectively, the solar cell controller 18 updates the command voltage $V_n$ and controls the solar cell 13 such that the present operation voltage $V_{pv}$ meets the command voltage $V_n$.

At step S409, similarly to step S404, the solar cell controller 18 determines whether the product of the present operation voltage $V_{pv}$ and the present operation current $I_{pv}$ is smaller than the previous generated power $P_n$. When the product is equal to or larger than the previous generated power $P_n$, the process returns to step S406. When the product is smaller than the previous generated power $P_n$, the process proceeds to step S410.

At step S410, the solar cell controller 18 updates the command voltage $V_n$ with a voltage obtained by changing the second changing voltage $\Delta V_2$ from the present command voltage $V_n$ in a direction corresponding to an inverted sign of the direction coefficient $V_{sgn}$. After the updating of the command voltage $V_n$, the process proceeds to step S411.

At step S411, similarly to step S403, the solar cell controller 18 controls the solar cell 13 such that the present operation voltage $V_{pv}$ meets the command voltage $V_n$. After the control of the solar cell 13, the subroutine of the second MTTP control is ended, and the process returns to step S108.

According to the power generation control apparatus of the first embodiment as described above, without the searching change in an unnecessarily wide range, the first MPPT control may achieve accurate detection of a maximum output point of the solar cell, that is, the operation voltage and the operation current that maximize the generated power. The following is a detailed description of such an effect.

Figure 9A:
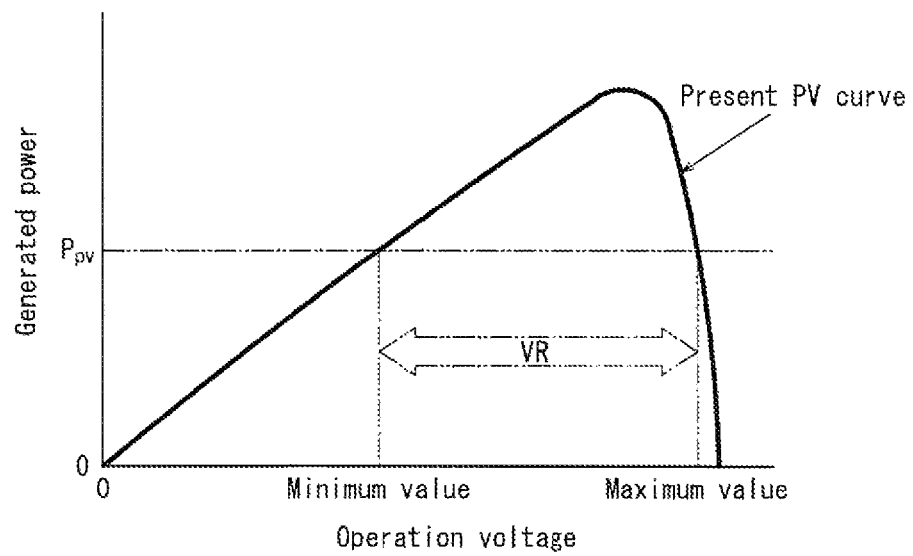
FIGS. 9A and 9B are graphs illustrating secure detection of an operation voltage for maximizing power generation in the first embodiment.
Figure 9B:
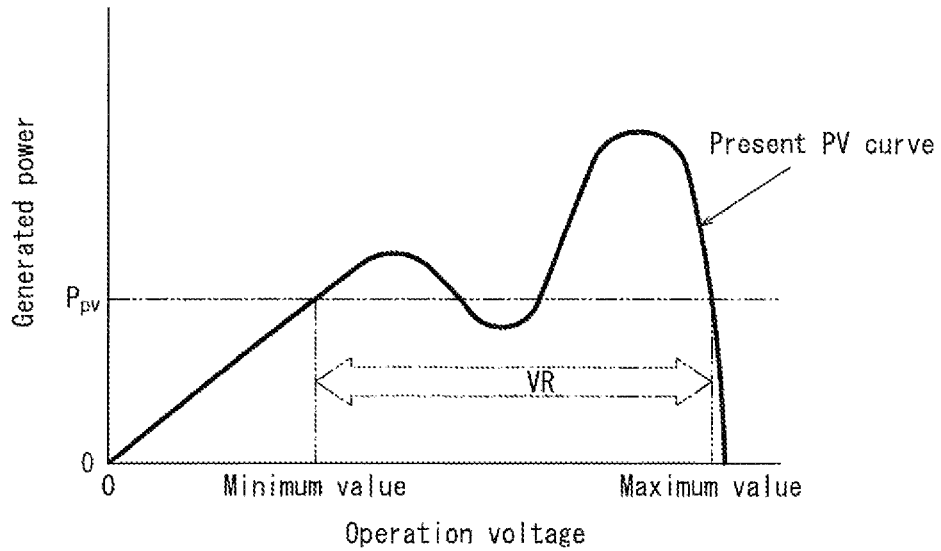

As illustrated in FIG. 9(a) and FIG. 9(b), the PV curve indicative of the relation between the operation voltage of the solar cell 13 and the generated power is upwardly convex with a maximum value. Accordingly, a range of the operation voltage where the generated power exceeds present generated power $P_{pv}$ lies between a minimum value and a maximum value of an operation voltage coordinate on an intersection of a present PV curve and the present generated power $P_{pv}$ (see a sign "VR"). In other words, the operation voltage for maximizing the generation power falls within this range. Accordingly, the use of the present generated power $P_{pv}$ and the present PV curve allows reliable detection of the operation voltage for maximizing the generated power.

Figure 10A:
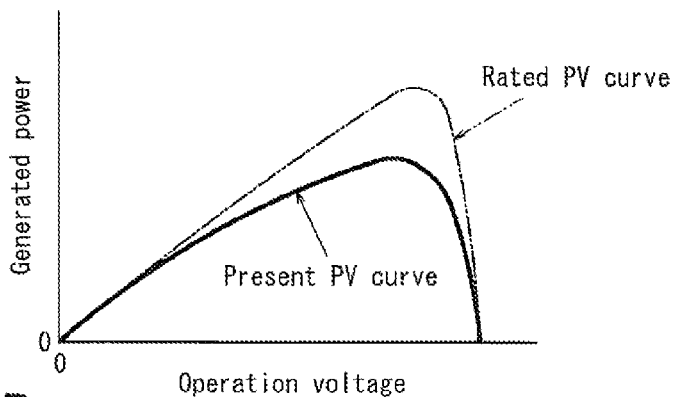
FIGS. 10A to 10C are graphs illustrating various PV curves included in the rated PV curve in the first embodiment.
Figure 10B:
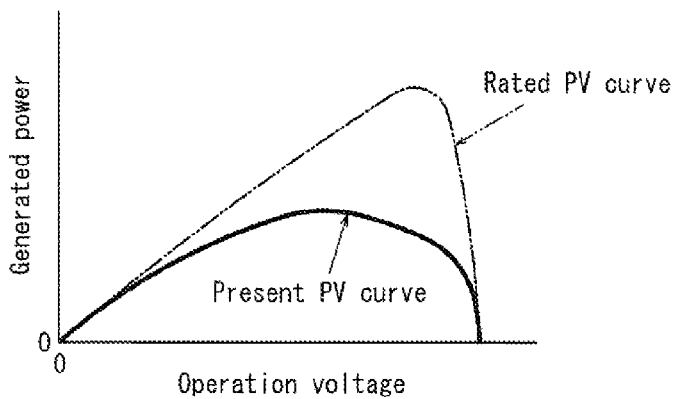
Figure 10C:
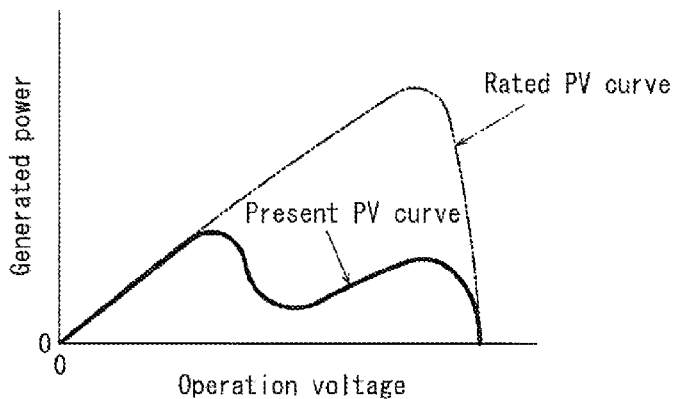

However, the power generated by the solar cell 13 is influenced by, in addition to the operation voltage, conditions such as, for example, a solar radiation amount, temperature, and a shaded portion. Therefore, the PV curve differs based on each condition. As illustrated in FIGS. 10(a), 10(b), and 10(c), however, any PV curve is included between the rated PV curve and an operation voltage axis. Therefore, the range of the operation voltage determined by using the present generated power $P_{pv}$ and the present rated PV curve is included within the range of the operation voltage determined by using the present generated power $P_{pv}$ and the rated PV curve as described above.

As such, the present embodiment determines a changing range of the operation voltage by using the present generated power $P_{pv}$ and the rated PV curve, and thus is capable of reliably detecting the operation voltage for maximizing the generated power.

According to the present embodiment, also, the first range is updated when the present generated power is larger than the maximum generated power detected during the first MPPT control. Therefore, as described below, the change in the driving variable in an unnecessarily wide range may be prevented.

Figure 11A:
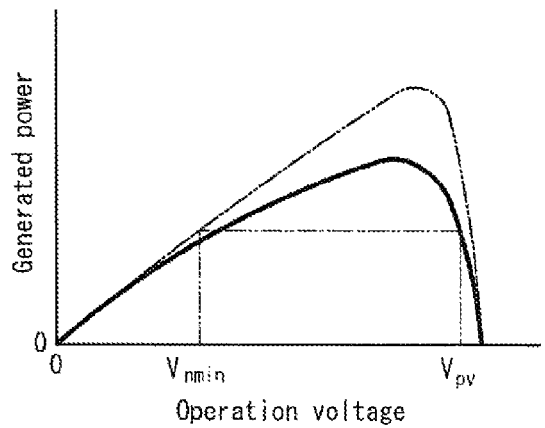
FIGS. 11A to 11C are graphs illustrating a determination method of a lower limit of a changing range with respect to a certain PV curve.
Figure 11B:
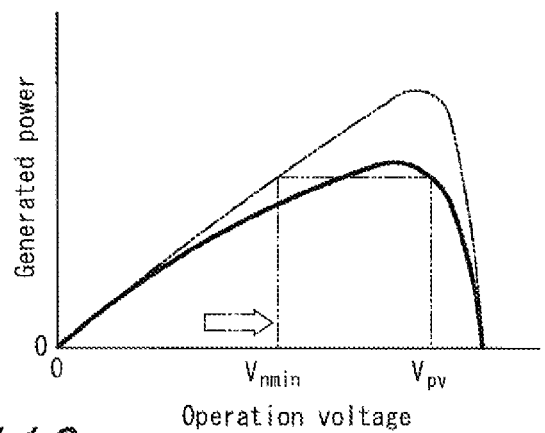
Figure 11C:
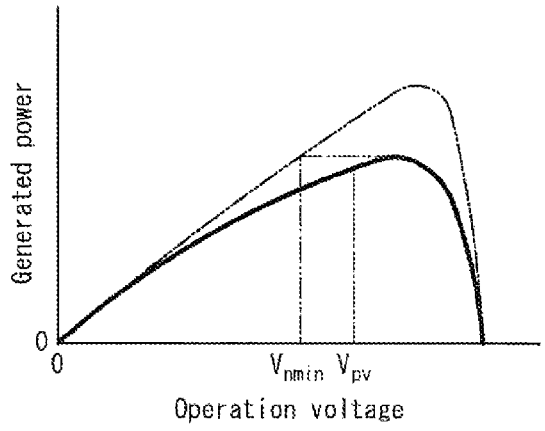

For example, the changing range of the searching change in a case where the relation between the operation voltage and the generated power when the solar cell 13 is in a certain state is indicated by the PV curve illustrated in FIG. 10(a) will be described. Based on the present operation voltage $V_{pv}$ before the downward direction MPPT control, the lower limit $V_{nmin}$ of the changing range is determined (see FIG. 11(a)). When the present operation voltage $V_{pv}$ is reduced and the generated power increases, the lower limit $V_{nmin}$ of the changing range is updated and increases to be higher than the previous lower limit (see FIG. 11(b)). When the generated power is maximized, the updating of the lower limit $V_{nmin}$ of the changing range is stopped (see FIG. 11(c)). Therefore, with respect to the PV curve illustrated in FIG. 10(a), the searching change is executed within a range between $V_{pv}$ in FIG. 11(a) and $V_{nmin}$ in FIG. 11(c).

Figure 12A:
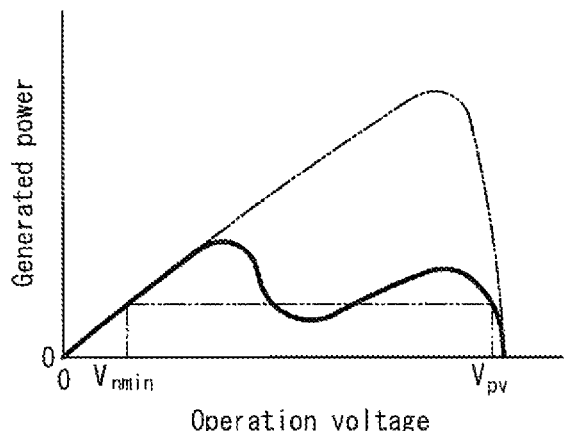
FIGS. 12A to 12C are graphs illustrating a determination method of the lower limit of the changing range with respect to another PV curve.
Figure 12B:
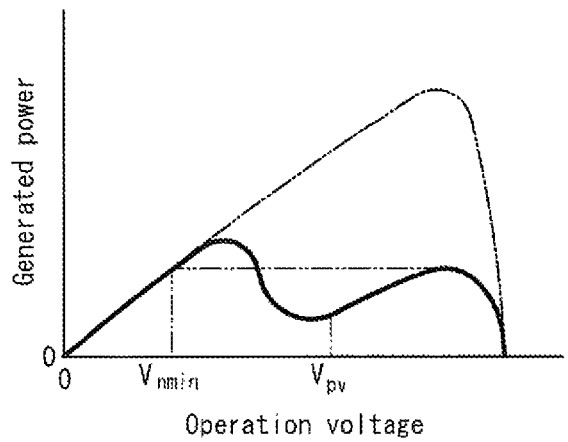
Figure 12C:
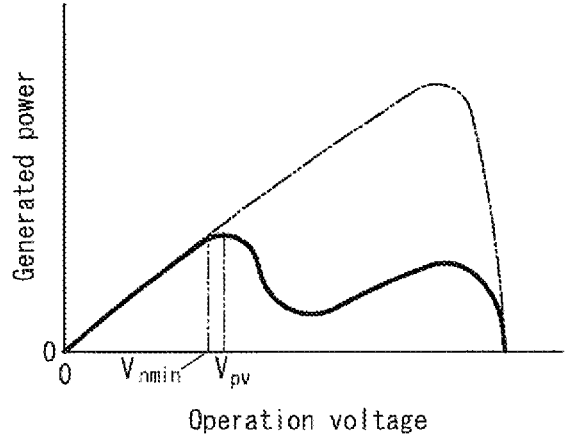

Also, the changing range of the searching change in a case where the relation between the operation voltage and the generation power when the solar cell 13 is in another state is indicated by the PV curve illustrated in FIG. 10(c) will be described. Based on the present operation voltage $V_{pv}$ before the downward direction MPPT control, the lower limit $V_{nmin}$ of the changing range is determined (see FIG. 12(a)). When the generated power reaches a first maximum value, the updating of the lower limit $V_{nmin}$ of the changing range is stopped, and the present operation voltage $V_{pv}$ is reduced until the generated power exceeds the first maximum value (see FIG. 12(b)). When the generated power exceeds the first maximum value, the updating of the lower limit $V_{nmin}$ of the changing range is resumed. When the generated power reaches a next maximum value, the updating is stopped (see FIG. 12(c)). As described above, with respect to the PV curve illustrated in FIG. 10(c), the searching change is executed within a range between $V_{pv}$ in FIG. 12(a) and $V_{nmin}$ in FIG. 12(c).

According to the configuration of the first embodiment as described above, the changing range is set to be applicable to any PV curve, thereby preventing the driving variation from being changed in an unnecessarily wide range.

According to the power generation control apparatus of the first embodiment, also, the increase in the operation voltage is executed by adjusting the operation current. Therefore, as described below, the generated power may be maximized highly accurately.

A rated PV curve in a range over the operation voltage for maximizing the generated power has a very large absolute value of gradient. Accordingly, the changing amount of the generated power per unit change amount of the operation voltage becomes large, leading to difficulty in fine adjustment of the generated power by increasing the operation voltage.

As such, according to the first embodiment, the operation voltage is increased by decreasing the operation current. Therefore, the generated power may be finely adjusted, and thus the generated power may be maximized highly accurately.

According to the first embodiment, also, the execution period of the downward direction MPPT control and the execution period of the upward direction MPPT control may be determined separately. Optimum periods for those controls vary based on the changing range of the driving variable. Therefore, based on the changing range of the downward direction MPPT control and the changing range of the upward direction MPPT control, the optimum execution periods may be determined.

According to the first embodiment, also, since the execution period of the first MPPT control is longer as the first range is narrower, the first MPPT control may be prevented from being executed at unnecessarily high frequency. When the changing range of the operation voltage or the operation current is narrow, as compared with a case where the changing range is wide, the probability of presence of the operation voltage or the operation current for maximizing the generated power is low. Therefore, the execution period of the first MPPT control is determined to be longer as the changing range is narrower, whereby the first MPPT control may be prevented from being executed at unnecessarily high frequency.

According to the first embodiment, further, since the second MPPT control is executed for the period shorter than the first MPPT control, degradation of power generation efficiency due to the change in the driving variable may be suppressed. The first MPPT control may achieve reliable detection of the operation voltage or the operation current for maximizing the generated power. On the other hand, in general, the second MPPT control takes a shorter time to maximize the generated power than the first MPPT control. According to the first embodiment, therefore, the first MPPT control is executed for a relatively long period, thereby suppressing the degradation of the power generation efficiency when another maximum value of the generation power becomes the maximum value. According to the first embodiment, also, the second MPPT control is executed for a relatively short period, thereby suppressing changing of the driving variable in a relatively long period. As a result, the degradation of the power generation efficiency may be suppressed.

Next, a second embodiment of the present invention will be described. The second embodiment is different from the first embodiment in terms of using, in place of the rated PV curve and the rated PI curve, approximation straight lines of the rated PV curve and the rated PI curve. The following is a description of the second embodiment focusing on points of difference thereof from the first embodiment. Note that units having the same functions and configurations as those of the first embodiment will be given the same reference numerals.

Figure 13:
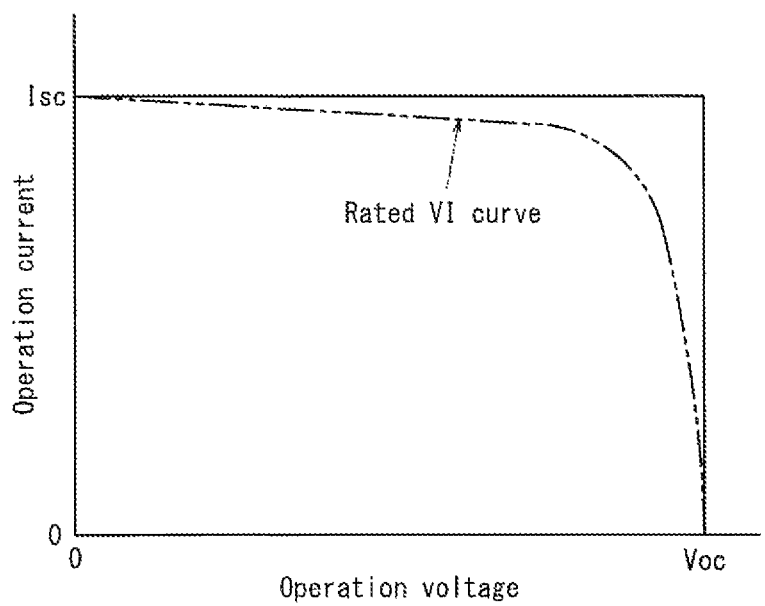
FIG. 13 is a graph illustrating an approximation straight line of the rated VI curve of the solar cell according to a second embodiment.
Figure 14:
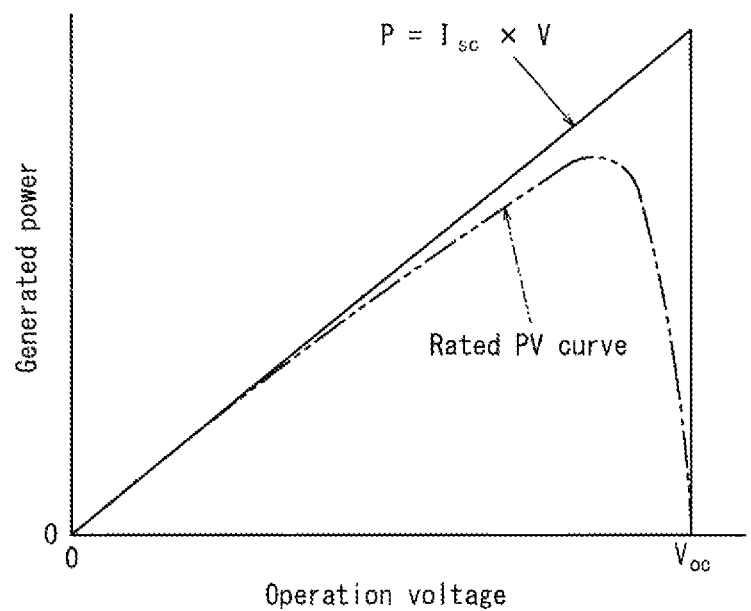
FIG. 14 is a graph illustrating an approximation straight line of the rated PV curve of the solar cell according to the second embodiment.
Figure 15:
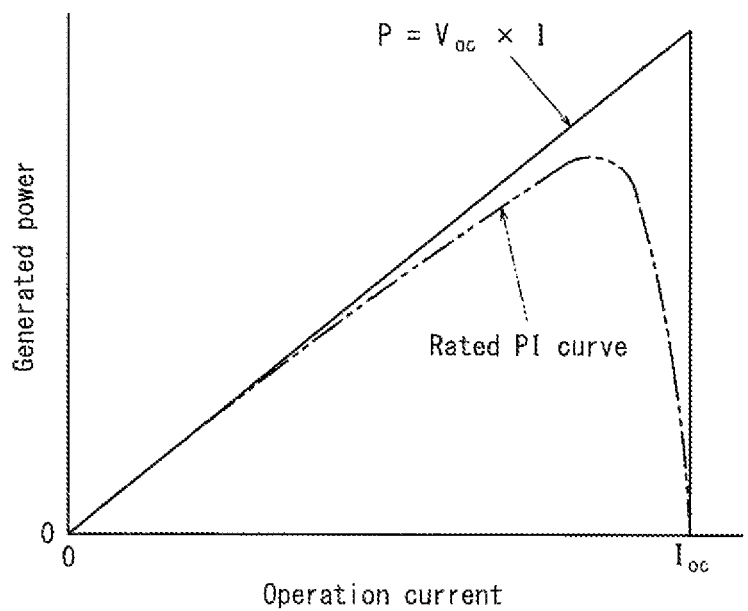
FIG. 15 is a graph illustrating an approximation straight line of the rated PI curve of the solar cell according to the second embodiment.

A VI curve indicative of the operation current with respect to the operation voltage of the solar cell 13 may be approximated by the short circuit current $I_{sc}$ and the open circuit voltage $V_{oc}$ as illustrated in FIG. 13. When the VI curve of the solar cell 13 is approximated in this manner, the rated PV curve is approximated by formulae (3) and (4) (see FIG. 14). Also, the rated PI curve is approximated by formulae (5) and (6) (see FIG. 15).

[Formula 11]

$$P = I_{sc} \times V \quad (3)$$

$$V = V_{oc} \quad (4)$$

$$P = V_{oc} \times I \quad (5)$$

$$I = I_{sc} \quad (6)$$

According to the second embodiment, the solar cell controller 18, by using an approximation straight line of the rated PV curve and an approximation straight line of the rated PI curve, executes the downward direction MPPT control and the upward direction MPPT control.

According to the power generation control apparatus of the second embodiment having the configuration as described above, similarly to the first embodiment, the first MPPT control, without changing the driving variation in an unnecessarily wide range, may achieve accurate detection of the maximum output point of the solar cell, i.e., the operation voltage and the operation current for maximizing the generated power.

Also, according to the second embodiment, similarly to the first embodiment, since the operation voltage is increased by adjusting the operation current, the generated power may be maximized highly accurately.

Also, according to the second embodiment, similarly to the first embodiment, the execution period of the downward direction MPPT control and the execution period of the downward direction MPPT control may be determined separately.

Also, according to the second embodiment, similarly to the first embodiment, since the execution period of the first MPPT control is longer as the first range is narrower, the first MPPT control may be prevented from being executed at unnecessarily high frequency.

Also, according to the second embodiment, similarly to the first embodiment, since the second MPPT control is executed for a period shorter than the first MPPT control, the degradation of the power generation efficiency due to the change in the driving variable may be suppressed.

According to the second embodiment, also, since linear approximation of the rated PV curve and the rated PI curve is carried out, the lower limit of the changing range may be calculated much more easily than the first embodiment. That is, based on an approximation straight line of the formula (3), provided that $P_{nmax}$ represents the maximum generated power during the searching change, the lower limit $V_{nmin}$ of the changing range of the operation voltage is calculated from formula (7). Also, based on an approximation curve of the formula (5), the lower limit $I_{nmin}$ of the changing range of the operation current is calculated from formula (8).

[Formula 12]

$$V_{nmin} = \frac{P_{nmax}}{I_{sc}} \quad (7)$$

$$I_{nmin} = \frac{P_{nmax}}{V_{oc}} \quad (8)$$

According to the second embodiment, also, in order to approximate the rated PV curve and the rated PI curve, the short circuit current $I_{sc}$ and the open circuit voltage $V_{oc}$ may be used. Therefore, there is no need for preliminarily detection, and the short circuit current $I_{sc}$ and the open circuit voltage $V_{oc}$ may be detected immediately before usage. Also, when the rated short circuit current $I_{sc}$ and the open circuit voltage $V_{oc}$ change due to, for example, aged deterioration of the solar cell 13, updating may be easily carried out.

Next, a third embodiment of the present invention will be described. The third embodiment is different from the first embodiment in terms of using, in place of the rated PV curve and the rated PI curve, the approximation curves of the rated PV curve and the rated PI curve. The following is a description of the third embodiment focusing on points of difference thereof from the first embodiment. Note that units having the same functions and configurations as those of the first embodiment will be given the same reference numerals.

Figure 16:
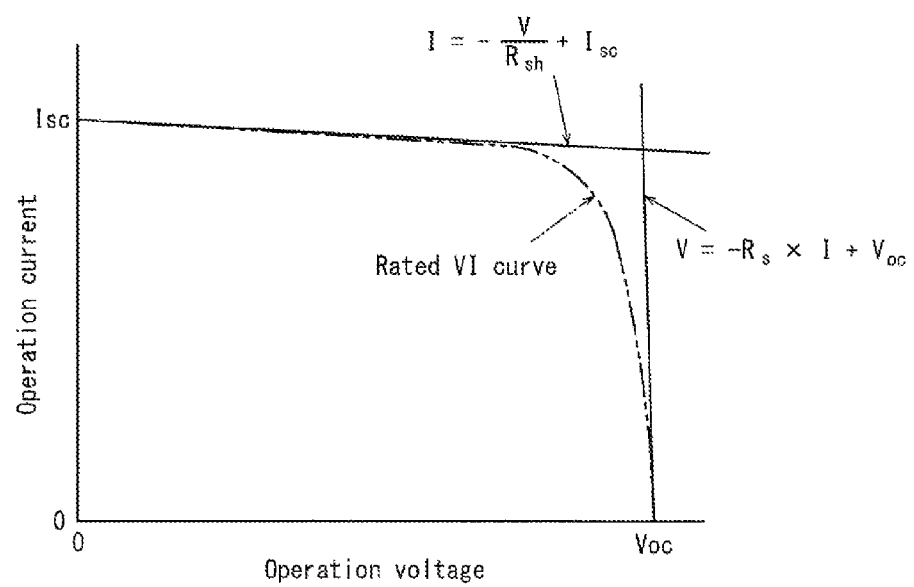
FIG. 16 is a graph illustrating an approximation straight line of the rated VI curve of the solar cell according to a third embodiment.

A portion of the VI curve indicative of the operation current with respect to the operation voltage of the solar cell 13, as illustrated in FIG. 16, may be approximated by formula (9) that uses the short circuit current $I_{sc}$ and parallel resistance $R_{sh}$ of the solar cell 13.

[Formula 13]

$$I = -\frac{V}{R_{sh}} + I_{sc} \quad (9)$$

Also, another portion of the VI curve, as illustrated in FIG. 16, may be approximated by formula (10) that uses the open circuit voltage $V_{oc}$ and series resistance $R_s$ of the solar cell 13.

[Formula 14]

$$V = -R_s \times I + V_{oc} \quad (10)$$

Figure 17:
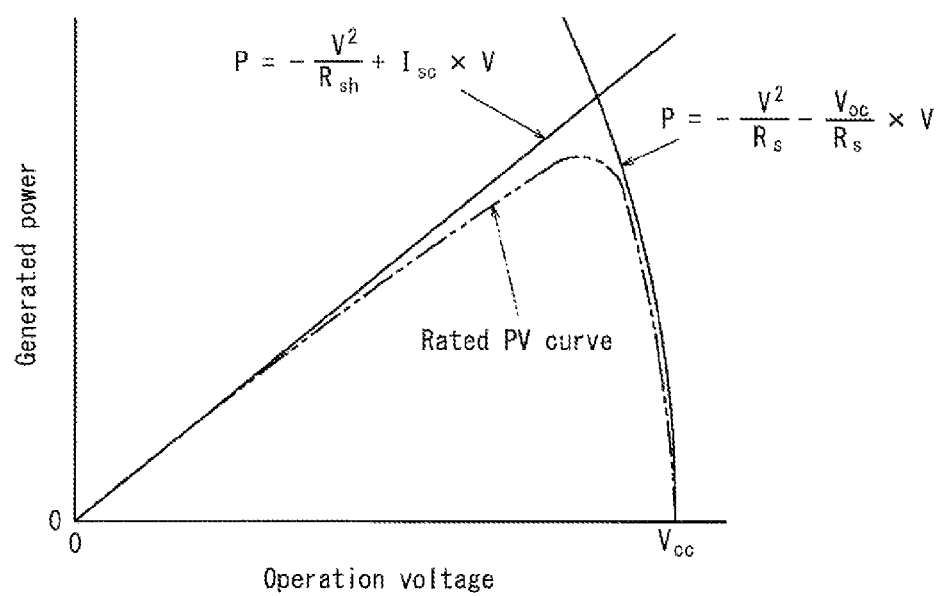
FIG. 17 is a graph illustrating an approximation straight line of the rated PV curve of the solar cell according to the third embodiment.
Figure 18:
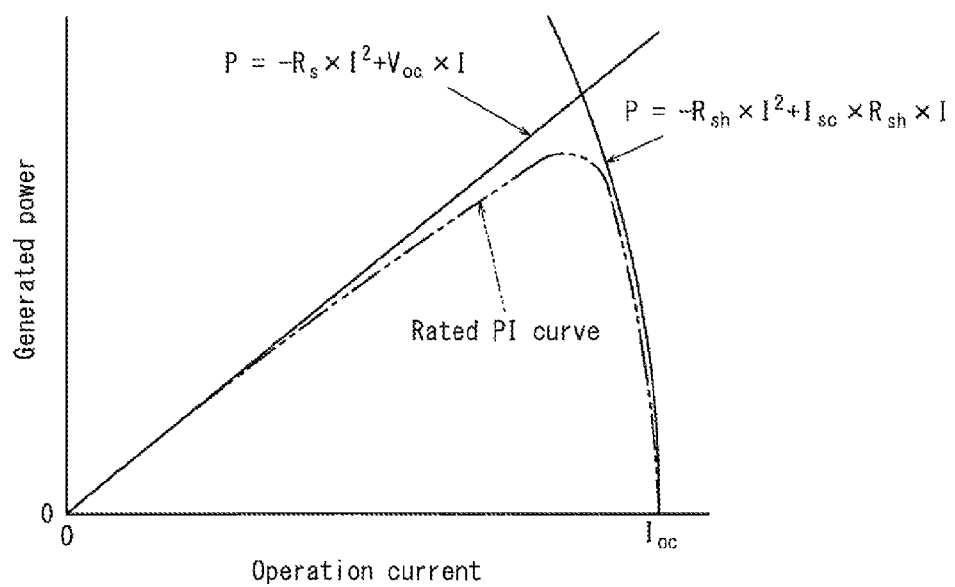
FIG. 18 is a graph illustrating an approximation straight line of the rated PI curve of the solar cell according to the third embodiment.

When the VI curve of the solar cell 13 is approximated in this manner, the rated PV curve is approximated by formulae (11) and (12) (see FIG. 17). Also, the rated PI curve is approximated by formulae (13) and (14) (see FIG. 18).

[Formula 15]

$$P = -\frac{V^2}{R_{sh}} + I_{sc} \times V \quad (11)$$

$$P = -\frac{V^2}{R_s} - \frac{V_{oc}}{R_s} \times V \quad (12)$$

$$P = -R_s \times I^2 + V_{oc} \times I \quad (13)$$

$$P = -R_{sh} \times I^2 + I_{sc} \times R_{sh} \times I \quad (14)$$

According to the third embodiment, the solar cell controller 18, by using the approximation curve of the rated PV curve and the approximation curve of the rated PI curve, executes the downward direction MPPT control and the upward direction MPPT control.

The power generation control apparatus of the third embodiment having the configuration as described above, similarly to the first embodiment, may carry out the first MPPT control that, without changing the driving variable in an unnecessarily wide range, may achieve accurate detection of the maximum output point of the solar cell, i.e., the operation voltage and the operation current for maximizing the generation power.

Also, according to the third embodiment, similarly to the first embodiment, since the operation voltage is increased by adjusting the operation current, the generated power may be maximized highly accurately.

Also, according to the third embodiment, similarly to the first embodiment, the execution period of the downward direction MPPT control and the execution period of the upward direction MPPT control may be determined separately.

Also, according to the third embodiment, similarly to the first embodiment, since the execution period of the first MPPT control is longer as the first range is narrower, the first MPPT control may be prevented from being executed at unnecessarily high frequency.

Also, according to the third embodiment, similarly to the first embodiment, since the second MPPT control is executed for a period shorter than the first MPPT control, the degradation of the power generation efficiency due to the change in the driving variable may be suppressed.

According to the third embodiment, also, since the rated PV curve and the rated PI curve are approximated by secondary curves, the lower limit of the changing range may be calculated more easily than the first embodiment. That is, based on the approximation curve of the formula (11), provided that $P_{nmax}$ represents the maximum generated power during the search changing, the lower limit $V_{nmin}$ of the changing range of the operation voltage is calculated from formula (15). Also, based on an approximation curve of the formula (13), the lower limit $I_{nmin}$ of the changing range of the operation current is calculated from formula (16).

[Formula 16]

$$V_{nmin} = \frac{I_{sc} \times R_{sh}}{2} - \sqrt{\left(\frac{I_{sc} \times R_{sh}}{2}\right)^2 - P_{nmax} \times R_{sh}} \quad (15)$$

$$I_{nmin} = \frac{V_{oc}}{2 \times R_s} - \sqrt{\left(\frac{V_{oc}}{2 \times R_s}\right)^2 - \frac{P_{nmax}}{R_s}} \quad (16)$$

Although the present invention has been described based on figures and the embodiments, it is to be understood that those who are ordinarily skilled in the art may easily vary or modify in a multiple manner based on disclosure of the present invention. Accordingly, such variations and modifications are included in the scope of the present invention.

For example, although in the second embodiment the rated PV curve is approximated by using the formula (3), the formula (17) may be used instead for the approximation. Similarly, although the rated PI curve is approximated by using the formula (5), the formula (18) may be used instead for the approximation.

[Formula 17]

$$P = \frac{1}{C_1} I_{sc} \times V \quad (17)$$

$$P = \frac{1}{C_2} V_{oc} \times I \quad (18)$$

In the formulae (17) and (18), $C_1$ an $C_2$ are invariables larger than 0 and equal to or smaller than 1.

REFERENCE SIGNS LIST 10 power supply system
11 load apparatus
12 commercial system
13 solar cell
14 power generation control apparatus
15 inverter
26 current and voltage sensor
17 timer
18 solar cell controller
19 method selector
20 range determinator

The invention claimed is:
1. A power generation control apparatus comprising:
a solar cell controller configured to calculate actual power generated by a solar cell while changing, within a first range, at least one of an operation current of the solar cell and an operation voltage of the solar cell that serve as driving variables, and configured to execute first MPPT control for controlling the solar cell to generate power by using a driving variable that maximizes generated power within the first range; and
a range determinator configured to update the first range based on maximum generated power calculated during the change in the driving variable within the first range and at least one of a rated PV curve indicative of a relation between the generated power and the operation voltage of the solar cell or an approximation line of the rated PV curve and a rated PI curve indicative of a relation between the operation current of the solar cell and the generated power or an approximation line of the rated PI curve,
wherein the approximation line of the rated PV curve is determined based on the following formula:

[Formula 1]

$$V = \frac{C_1}{I_{sc}} \times P$$

provided that P represents the generated power, V represents the operation voltage, $I_{sc}$ represents a short circuit current of the solar cell, and $C_1$ represents a first invariable larger than 0 and equal to or smaller than 1.

2. The power generation control apparatus according to claim 1, wherein at least one of an upper limit and a lower limit of the first range updated by the range determinator corresponds to the operation voltage for allowing maximum power generation on the rated PV curve or on the approximation line of the rated PV curve, and the other corresponds to the operation current for allowing maximum power generation on the rated PI curve or on the approximation line of the rated PI curve.

3. The power generation control apparatus according to claim 1, wherein the first MPPT control includes upward direction MPPT control for changing the driving variable so as to increase the operation voltage and downward direction MPPT control for changing the driving variable so as to reduce the operation voltage, and the power generation control apparatus separately includes an execution period of the upward direction MPPT control and an execution period of the downward direction MPPT control.

4. The power generation control apparatus according to claim 1, wherein the first range is determined such that a lower limit of the operation voltage is expressed by the following formula:

[Formula 2]

$$\frac{C_1}{I_{sc}} \times P_{nmax}$$

provided that $P_{nmax}$ represents the maximum generated power.

5. A power generation control apparatus comprising:
a solar cell controller configured to calculate actual power generated by a solar cell while changing, within a first range, at least one of an operation current of the solar cell and an operation voltage of the solar cell that serve as driving variables, and configured to execute first maximum power point tracking (MPPT) control for controlling the solar cell to generate power by using a driving variable that maximizes generated power within the first range; and
a range determinator configured to update the first range based on maximum generated power calculated during the change in the driving variable within the first range and at least an approximation line of a rated PI curve indicative of a relation between the operation current of the solar cell and the generated power,
wherein the approximation line of the rated PI curve is determined based on the following formula:

[Formula 3]

$$I = \frac{C_2}{V_{oc}} \times P$$

provided that P represents the generated power, I represents the operation current, $V_{oc}$ represents an open circuit voltage of the solar cell, and $C_2$ represents a second invariable larger than 0 and equal to or smaller than 1.

6. The power generation control apparatus according to claim 5, wherein the first range is determined such that a lower limit of the operation current is expressed by the following formula:

[Formula 4]

$$\frac{C_2}{V_{oc}} \times P_{nmax}$$

provided that $P_{nmax}$ represents the maximum generated power.

7. A power generation control apparatus comprising:
a solar cell controller configured to calculate actual power generated by a solar cell while changing, within a first range, at least one of an operation current of the solar cell and an operation voltage of the solar cell that serve as driving variables, and configured to execute first maximum power point tracking (MPPT) control for controlling the solar cell to generate power by using a driving variable that maximizes generated power within the first range; and
a range determinator configured to update the first range based on maximum generated power calculated during the change in the driving variable within the first range and at least an approximation line of a rated PI curve indicative of a relation between the operation current of the solar cell and the generated power,
wherein the approximation line of the rated PI curve is determined based on the following formula:

[Formula 5]

$$P = \frac{V^2}{R_{sh}} + V \times I_{sc}$$

provided that P represents the generated power, V represents the operation voltage, $R_{sh}$ represents parallel resistance of the solar cell, and $I_{sc}$ represents a short circuit current of the solar cell.

8. The power generation control apparatus according to claim 7, wherein the first range is determined such that a lower limit of the operation voltage is expressed by the following formula:

[Formula 6]

$$\frac{I_{sc} \times R_{sh}}{2} - \sqrt{\left(\frac{I_{sc} - R_{sh}}{2}\right)^2 - P_{nmax} \times R_{sh}}$$

provided that $P_{nmax}$ represents the maximum generated power.

9. A power generation control apparatus comprising:
a solar cell controller configured to calculate actual power generated by a solar cell while changing, within a first range, at least one of an operation current of the solar cell and an operation voltage of the solar cell that serve as driving variables, and configured to execute first maximum power point tracking (MPPT) control for controlling the solar cell to generate power by using a driving variable that maximizes generated power within the first range; and a range determinator configured to update the first range based on maximum generated power calculated during the change in the driving variable within the first range and at least an approximation line of a rated PI curve indicative of a relation between the operation current of the solar cell and the generated power, wherein the approximation line of the rated PI curve is determined based on the following formula:

[Formula 7]

$$P = -\frac{I^2}{R_s} + V_{oc} \times I$$

provided that P represents the generated power, I represents the operation current, $R_s$ represents series resistance of the solar cell, and $V_{oc}$ represents an open circuit voltage of the solar cell.

10. The power generation control apparatus according to claim 9, wherein the first range is determined such that a lower limit of the operation voltage is expressed by the following formula:

[Formula 8]

$$\frac{V_{oc}}{2 \times R_s} - \sqrt{\left(\frac{V_{oc}}{2 \times R_s}\right)^2 - \frac{P_{nmax}}{R_s}}$$

provided that $P_{nmax}$ represents the maximum generated power.

11. A power generation control apparatus comprising:
a solar cell controller configured to calculate actual power generated by a solar cell while changing, within a first range, at least one of an operation current of the solar cell and an operation voltage of the solar cell that serve as driving variables, and configured to execute first maximum power point tracking (MPPT) control for controlling the solar cell to generate power by using a driving variable that maximizes generated power within the first range; and
a range determinator configured to update the first range based on maximum generated power calculated during the change in the driving variable within the first range and at least one of a rated PV curve indicative of a relation between the generated power and the operation voltage of the solar cell or an approximation line of the rated PV curve and a rated PI curve indicative of a relation between the operation current of the solar cell and the generated power or an approximation line of the rated PI curve,
wherein the first MPPT control includes upward direction MPPT control for changing the driving variable so as to increase the operation voltage and downward direction MPPT control for changing the driving variable so as to reduce the operation voltage, and the power generation control apparatus separately includes an execution period of the upward direction MPPT control and an execution period of the downward direction MPPT control, and
wherein in using the operation voltage as the driving variable, the execution period of the downward direction MPPT control is set to be longer as a ratio of a changing range of the voltage corresponding to the first range of the open circuit voltage of the solar cell is smaller, and the execution period of the upward direction MPPT control is set to be longer as a ratio of a changing range of the current to the short circuit current of the solar cell is smaller, the changing range of the current corresponding to the first range.

12. The power generation control apparatus according to claim 11, comprising a method selector configured to control the solar cell controller to execute the first MPPT control in a first period and, in a second period shorter than the first period, a second MPPT control for changing the generated power in an increasing direction until the actual power generated by the solar cell reaches a maximum value.

13. A solar power generation system comprising:
a solar cell;
a solar cell controller configured to calculate actual power generated by the solar cell while changing, within a first range, at least one of an operation current of the solar cell and an operation voltage of the solar cell that serve as driving variables and configured to execute first MPPT control for controlling the solar cell to generate power by using a driving variable that maximizes generated power within the first range; and
a range determinator configured to update the first range based on maximum generated power calculated during the change in the driving variable within the first range and at least one of a rated PV curve indicative of a relation between the operation voltage of the solar cell and the generated power or an approximation line of the rated PV curve and a rated PI curve indicative of a relation between the operation current of the solar cell and the generated power or an approximation line of the rated PI curve,
wherein the approximation line of the rated PV curve is determined based on the following formula:

[Formula 1]

$$V = \frac{C_1}{I_{sc}} \times P$$

provided that P represents the generated power, V represents the operation voltage, $I_{sc}$ represents a short circuit current of the solar cell, and $C_1$ represents a first invariable larger than 0 and equal to or smaller than 1.

14. A power generation control method for maximizing power generation of a solar cell while changing at least one of an operation current of the solar cell and an operation voltage of the solar cell that serve as driving variables, the power generation control method comprising:
a changing step of changing the driving variable by a predetermined amount;
a comparing step of comparing present generated power of the solar cell controlled to generate power by using the driving variable changed at the changing step to maximum generated power;
an updating step of, when the present generated power is greater than the maximum generated power, updating the maximum generated power with the present generated power;
a setting step of setting a changing range of the driving variable based on the maximum generated power and at least one of a rated PV curve indicative of a relation between the operation voltage of the solar cell and generated power or an approximation line of the rated PV curve and a rated PI curve indicative of a relation between an operation current of the solar cell and the generated power or an approximation line of the rated PI curve;

a repeating step of repeating the changing step, the comparing step, the updating step, and the setting step until the driving variable reaches an upper limit or a lower limit determined based on the changing range; and a power generation step of controlling the solar cell to generate power by using the driving variable used for generating the maximum power when the driving variable reaches the upper limit or the lower limit, wherein the approximation line of the rated PV curve is determined based on the following formula:

[Formula 1]

$$V = \frac{C_1}{I_{sc}} \times P$$

provided that P represents the generated power, V represents the operation voltage, $I_{sc}$ represents a short circuit current of the solar cell, and $C_1$ represents a first invariable larger than 0 and equal to or smaller than 1.

* * * * *